US008324974B1

(12) United States Patent
Bennett

(10) Patent No.: US 8,324,974 B1
(45) Date of Patent: Dec. 4, 2012

(54) REGULATING POWER CONSUMPTION OF DIGITAL CIRCUITRY USING A MULTI-LAYER RING OSCILLATOR

(75) Inventor: George J. Bennett, Murrieta, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 13 days.

(21) Appl. No.: 12/972,121

(22) Filed: Dec. 17, 2010

(51) Int. Cl.
*H03K 3/03* (2006.01)
*G05F 1/40* (2006.01)
*G05F 1/56* (2006.01)

(52) U.S. Cl. ............. 331/57; 331/44; 323/282; 323/271

(58) Field of Classification Search ................ 331/57, 331/44; 323/222, 223, 225, 268, 271, 282–285, 323/288
See application file for complete search history.

(56) References Cited

U.S. PATENT DOCUMENTS

| | | | |
|---|---|---|---|
| 5,039,893 A | 8/1991 | Tomisawa | |
| 5,216,302 A | 6/1993 | Tanizawa | |
| 5,719,514 A | 2/1998 | Sato | |
| 5,811,983 A | 9/1998 | Lundberg | |
| 5,812,031 A | 9/1998 | Saotome et al. | |
| 6,157,231 A | 12/2000 | Wasson | |
| 6,157,247 A | 12/2000 | Abdesselem et al. | |
| 6,259,293 B1 | 7/2001 | Hayase et al. | |
| 6,333,652 B1 | 12/2001 | Iida et al. | |
| 6,535,735 B2 | 3/2003 | Underbrink et al. | |
| 6,870,410 B1 | 3/2005 | Doyle et al. | |
| 6,930,521 B2 | 8/2005 | Wald | |
| 7,071,710 B2 | 7/2006 | Marshall et al. | |
| 7,129,763 B1 | 10/2006 | Bennett et al. | |
| 7,148,755 B2 | 12/2006 | Naffziger et al. | |
| 7,205,805 B1 | 4/2007 | Bennett | |
| 7,330,019 B1 | 2/2008 | Bennett | |
| 7,486,060 B1 | 2/2009 | Bennett | |
| 7,489,204 B2 * | 2/2009 | Habitz et al. | 331/44 |
| 7,659,126 B1 | 2/2010 | Smith et al. | |
| 7,733,189 B1 | 6/2010 | Bennett | |
| 7,733,489 B2 | 6/2010 | Ding | |
| 2005/0218871 A1 | 10/2005 | Kang et al. | |

OTHER PUBLICATIONS

H. Zarrabi, A. J. Al-Khalili, Y. Savaria, "An interconnect-aware delay model for dynamic voltage scaling in NM technologies", Proceedings of the 19th ACM Great Lakes Symposium on VLSI 2009, Boston Area, MA, USA, May 10-12, 2009.

Feng Luo, et al., "Integrated Adaptive Step-Up/Down Switching DC-DC Converter with Tri-Band Tri-Mode Digital Control for Dynamic Voltage Scaling", IEEE International Symposium on Industrial Electronics (ISIE08), pp. 142-147, Jun. 2008.

* cited by examiner

*Primary Examiner* — Ryan Johnson

(57) ABSTRACT

A computing device is disclosed comprising digital circuitry fabricated on a multi-layer integrated circuit including a first layer and a second layer, and a multi-layer ring oscillator operable to generate a propagation delay frequency representing a propagation delay of the integrated circuit, wherein the multi-layer ring oscillator comprises a first interconnect fabricated on the first layer and a second interconnect fabricated on the second layer. The propagation delay frequency is compared to a reference frequency to generate a frequency error, and at least one of a supply voltage and a clocking frequency applied to the digital circuitry is adjusted in response to the frequency error.

24 Claims, 7 Drawing Sheets

REGULATING POWER CONSUMPTION OF DIGITAL CIRCUITRY USING A MULTI-LAYER RING OSCILLATOR

BACKGROUND

Description of the Related Art

Regulating power consumption of digital circuitry has become an important consideration in designing computing and consumer devices such as desktop and laptop computers, televisions, audio equipment, smartphones, cameras, etc. In portable devices, regulating power consumption helps increase the life of battery power, and in general, regulating power consumption helps reduce operating costs, particularly for large enterprise companies that may continuously operate hundreds or even thousands of computing and storage devices.

FIG. 1A illustrates a prior art technique for regulating power consumption of digital circuitry including a critical path circuit 2. A propagation delay circuit 4 generates a propagation delay frequency 6 representing a propagation delay of the critical path circuit 2. A frequency generator 8 generates a reference frequency 10 and a frequency comparator 12 for generating a frequency error 14 representing a difference between the reference frequency 10 and the propagation delay frequency 6. An adjustable circuit 16, responsive to the frequency error 14, adjusts at least one of a supply voltage and a clocking frequency 18 applied to the critical path circuit 2 in order to maintain a target performance and/or a target power consumption.

For example, if the frequency error 14 indicates the propagation delay frequency 6 has fallen bellow a threshold, the adjustable circuit 16 may increase the supply voltage to the digital circuitry to maintain error free operation and performance by maintaining a target propagation delay. Alternatively, the adjustable circuit 16 may decrease the clocking frequency applied to the digital circuitry to maintain error free operation at a lower performance while decreasing the power consumption.

The propagation delay frequency 6 of FIG. 1A may be generated by a ring oscillator shown in FIG. 1B which comprises a plurality of inverters $20_0$-$20_N$ connected in a ring configuration and an NAND gate 22 for enabling the ring oscillator in response to an enable signal 24. The output frequency of the ring oscillator depends on the number of inverters $20_0$-$20_N$, the amplitude of the supply voltage 18, and other factors, such as variations in fabrication process, ambient temperature, etc.

DETAILED DESCRIPTION OF EMBODIMENTS OF THE INVENTION

Figure 1A:
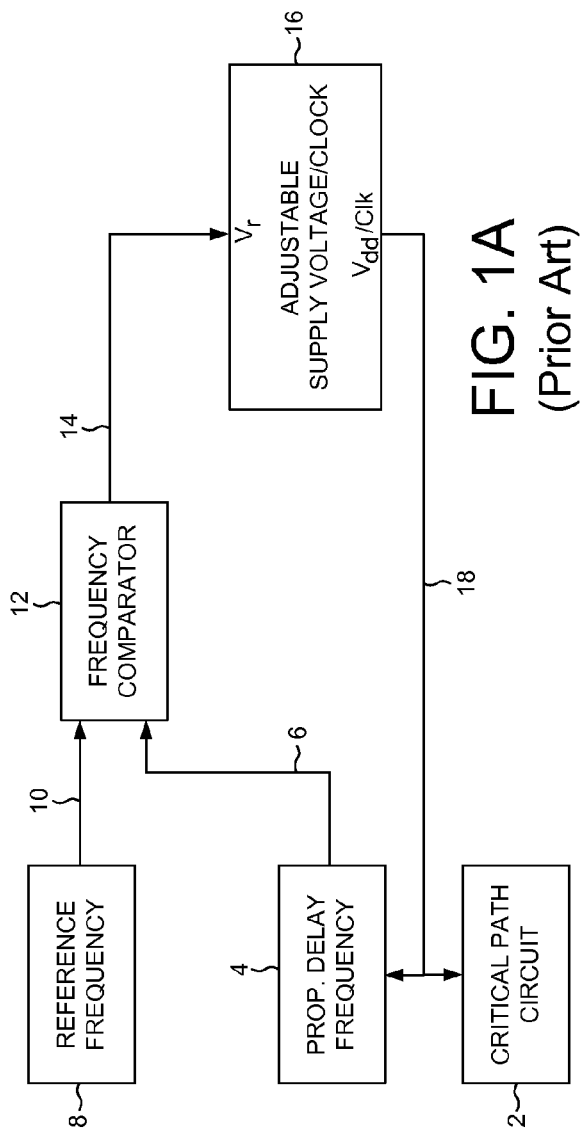
FIG. 1A shows a prior art computing device including a regulator circuit for adjusting at least one of a supply voltage and a clocking frequency applied to digital circuitry, wherein the regulator circuit employs a single layer ring oscillator.
Figure 1B:
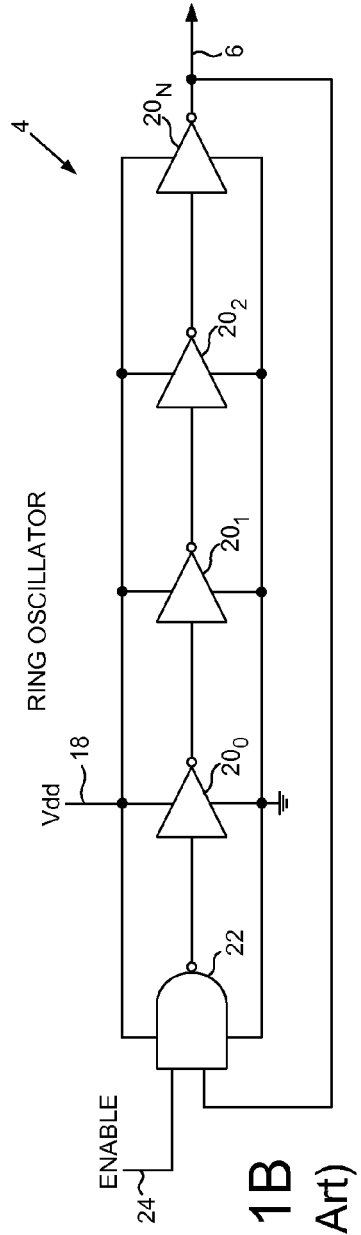
FIG. 1B shows a prior art single layer ring oscillator for use in the regulator circuit of FIG. 1A.
Figure 2:
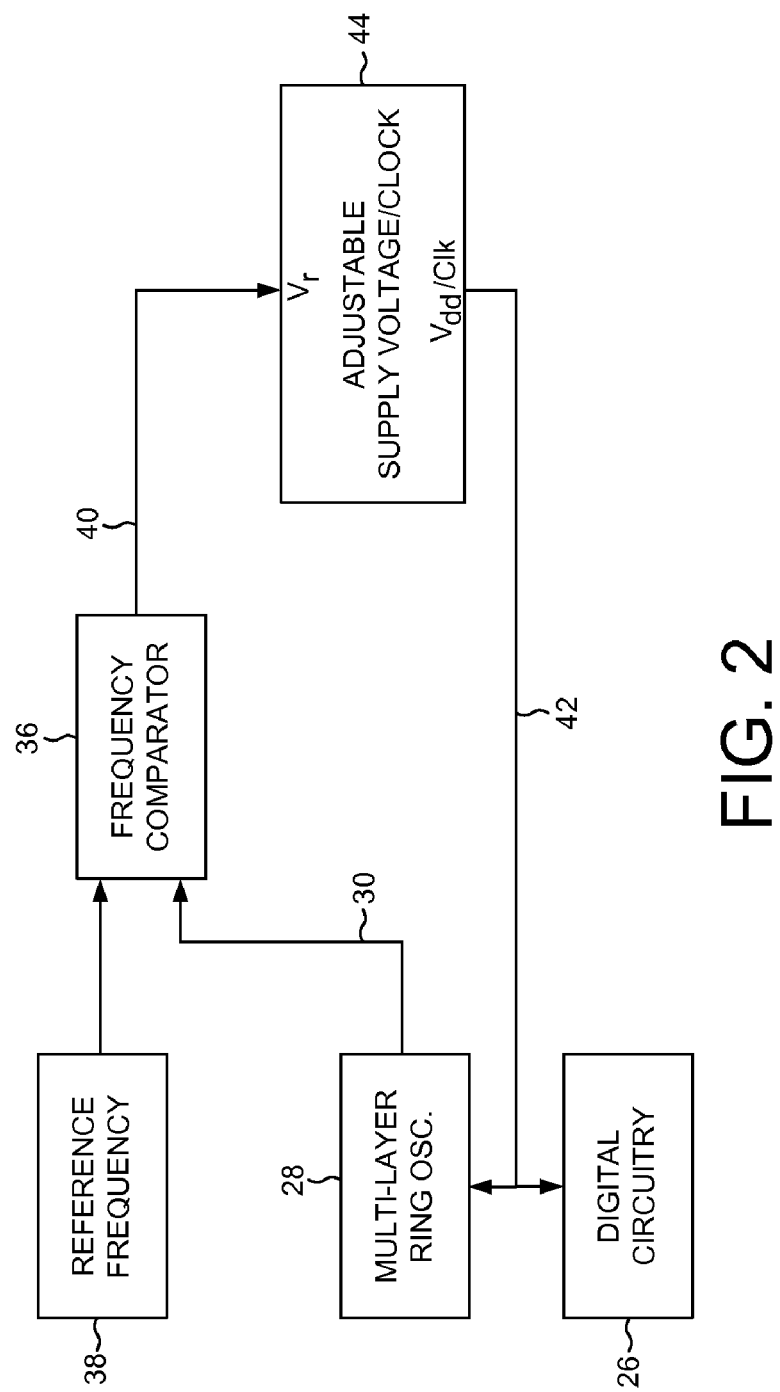
FIG. 2 shows a computing device including a regulator circuit according to an embodiment of the present invention for adjusting at least one of a supply voltage and a clocking frequency applied to digital circuitry, wherein the regulator circuit employs a multi-layer ring oscillator.

FIG. 2 shows a computing device according to an embodiment of the present invention comprising digital circuitry 26 fabricated on a multi-layer integrated circuit including a first layer and a second layer, and a multi-layer ring oscillator 28 operable to generate a propagation delay frequency 30 representing a propagation delay of the integrated circuit, wherein the multi-layer ring oscillator 28 comprises a first interconnect fabricated on the first layer and a second interconnect fabricated on the second layer. The propagation delay frequency 30 is compared 36 to a reference frequency 38 to generate a frequency error 40, and at least one of a supply voltage and a clocking frequency 42 applied to the digital circuitry 26 is adjusted 44 in response to the frequency error 40.

Each layer of the multi-layer integrated circuit may comprise any suitable material, such as metal, metal silicide, or polysilicon. In one embodiment, the multi-layer ring oscillator 28 of FIG. 2 comprising a plurality of inverting elements that are fabricated on a first layer, wherein at least one interconnect for connecting the inverting elements is fabricated on a second layer. In other embodiments, the inverting elements may be fabricated on more than one layer which may be the same or different from the interconnect layers.

Using a multi-layer ring oscillator to adjust at least one of the supply voltage and the clocking frequency applied to the digital circuitry helps compensate for anomalies in the fabrication process that can increase the propagation delay of the layers. For example, uneven etching or other physical anomalies can increase the capacitance between adjacent layers, thereby slowing the interconnect signal paths. The adjustable circuit 44 of FIG. 2 compensates for these anomalies by adjusting the supply voltage to maintain a target propagation delay across the layers, or by adjusting the clocking frequency of the digital circuitry to account for the longest propagation delay across the layers.

Figure 3:
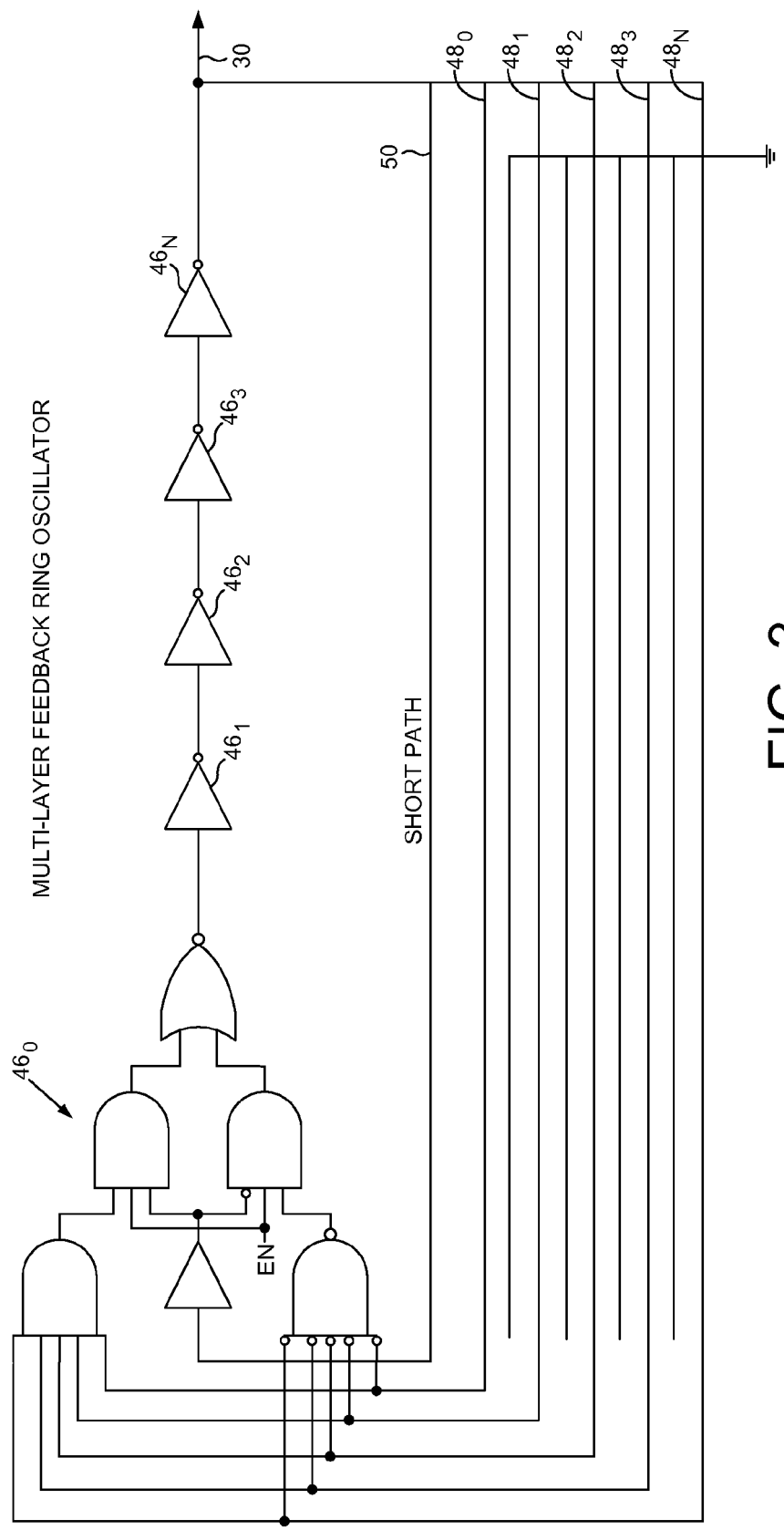
FIG. 3 shows an embodiment of a multi-layer ring oscillator according to an embodiment of the present invention wherein multiple feedback paths are fabricated on respective layers of an integrated circuit.

FIG. 3 shows a multi-layer ring oscillator 28 according to an embodiment of the present invention comprising a number of inverting elements $46_0$-$46_N$, and a plurality of interconnects in the form of feedback paths $48_0$-$48_N$ fabricated on multiple layers, including a first feedback path $48_0$ fabricated on a first layer, and a second feedback path $48_1$ fabricated on a second layer. The first inverting element $46_0$ comprises a number of logic gates that are configured to wait until the slowest feedback path changes state before the output of inverting element $46_0$ changes state so that the longest propagation delay through the multiple layers governs the output frequency (the delay frequency 30). In the embodiment of FIG. 3, the multi-layer ring oscillator comprises a short path 50 that sets up the receiving gates of the first inverting element $46_0$ to select the proper polarity of the propagated oscillation signal.

Figure 4:
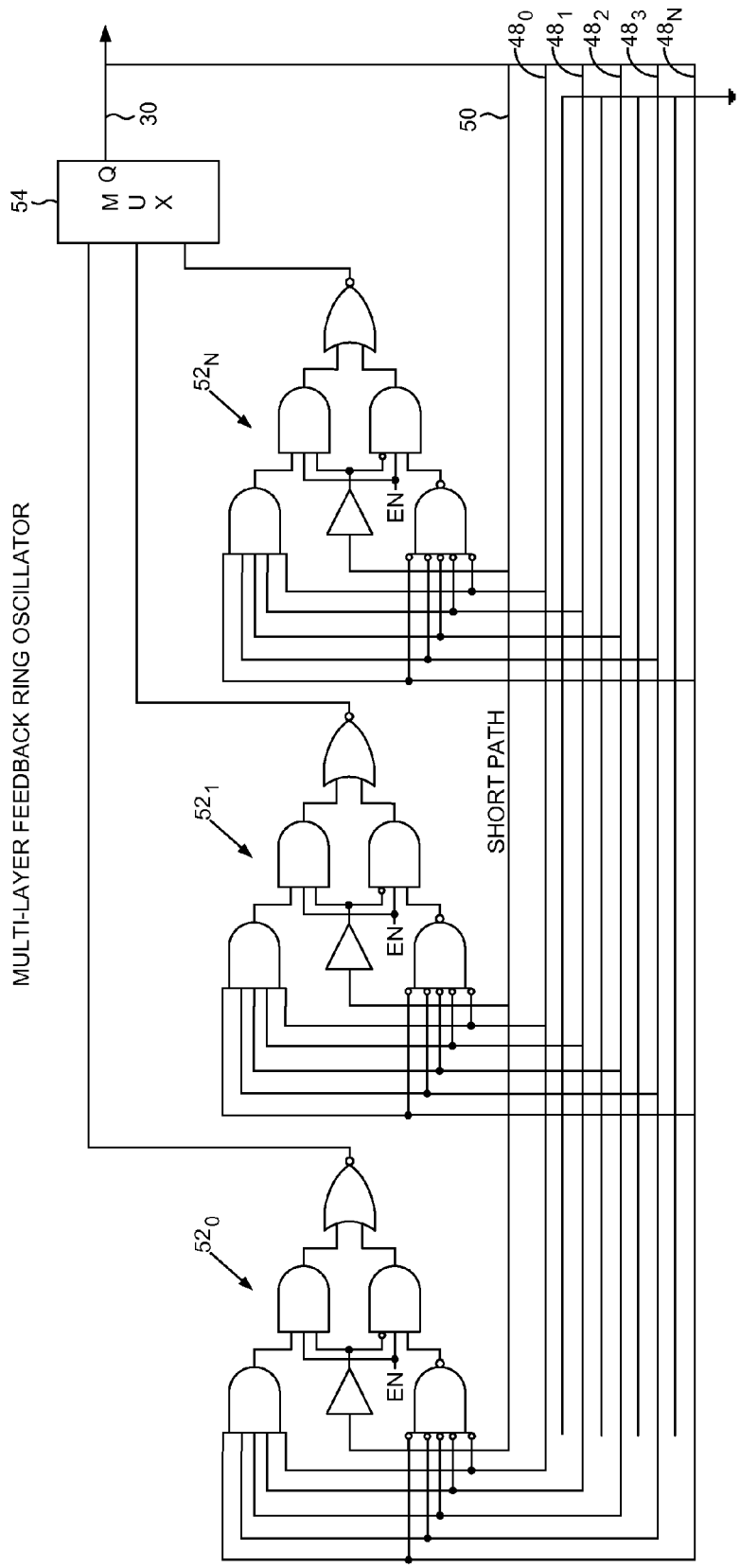
FIG. 4 shows an embodiment of a multi-layer ring oscillator according to an embodiment of the present invention comprising a configurable number of inverting elements.

FIG. 4 shows a multi-layer ring oscillator 28 according to an embodiment of the present invention comprising a configurable number of inverting elements $52_0$-$52_N$. A multiplexer 54 selects the output of one of the inverting elements as the signal applied to the feedback paths $48_0$-$48_N$. Accordingly, the length of the feedback paths for each inverting element $52_0$-$52_N$ is configurable to substantially match any length of interconnect path through the multiple layers. For example, in one embodiment the length of the feedback paths $48_0$-$48_N$ may correspond to the length of a critical path circuit implemented within the digital circuitry. Accordingly, the multiplexer 54 can be configured so that the length of the feedback paths $48_0$-$48_N$ substantially match the length of the critical path circuit. In another embodiment, the length of the feedback paths $48_0$-$48_N$ may be selected (scaled) to match a multiple of a target interconnect path.

Figure 5:
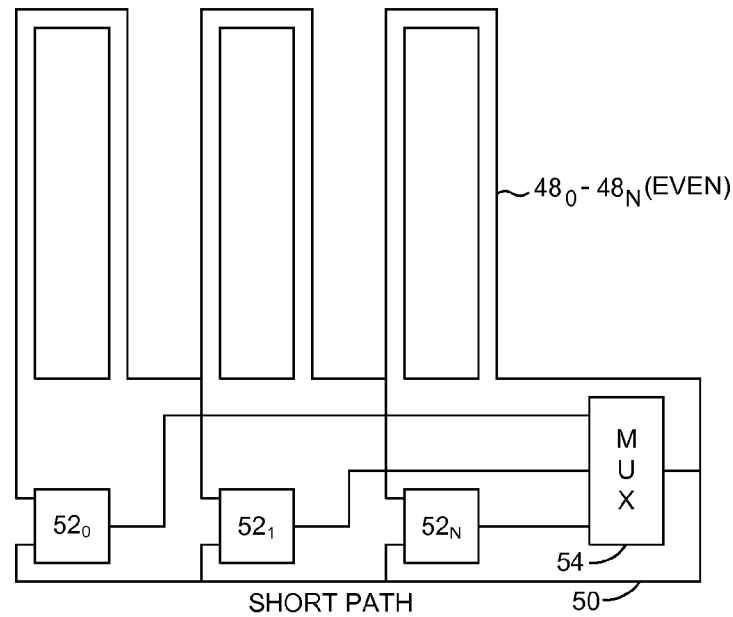
FIG. 5 shows an embodiment of a multi-layer ring oscillator according to an embodiment of the present invention wherein the feedback paths comprise a serpentine pattern.

FIG. 5 shows a multi-layer ring oscillator 28 according to an embodiment of the present invention similar to the embodiment of FIG. 4 except that the feedback paths $48_0$-$48_N$ comprise a serpentine pattern which increases the length of the paths along each layer. Only the first layer and corresponding feedback path is shown in FIG. 5, whereas the other feedback paths (not shown) are fabricated in separate layers underneath the first layer.

Figure 6:
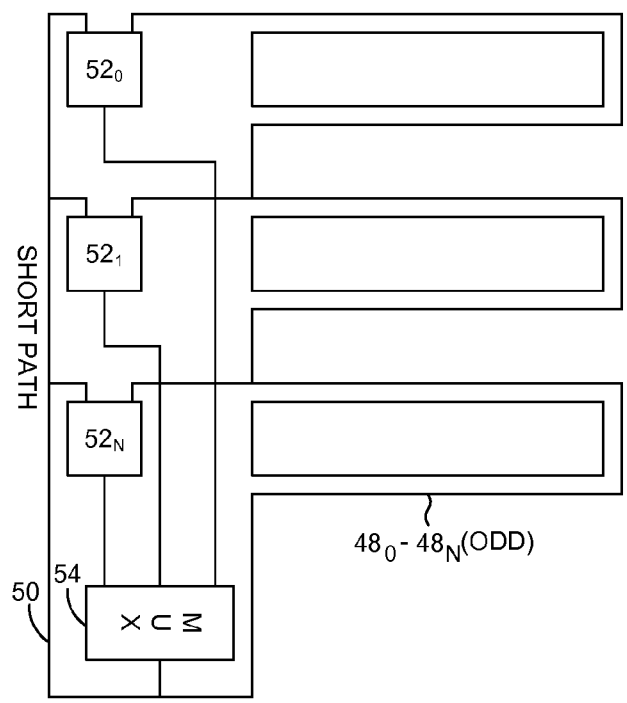
FIG. 6 shows a second multi-layer ring oscillator comprising feedback paths aligned in an orthogonal direction to the feedback paths of a first multi-layer ring oscillator according to an embodiment of the present invention.

In one embodiment, the digital circuitry 26 of FIG. 2 is fabricated in the integrated circuit such that on even numbered layers the interconnects are routed in a first direction (e.g., vertically), and on odd numbered layers the interconnects are routed in a second direction (e.g., horizontally). Accordingly, an embodiment of the present invention may comprise a first multi-layer ring oscillator having interconnects (e.g., feedback paths) fabricated on the even numbered layers, and a second multi-layer ring oscillator having interconnects (e.g., feedback paths) fabricated on the odd numbered layers (i.e., the layers of the two ring oscillators are interleaved). For example, a first multi-layer ring oscillator (FIG. 5) may comprise feedback paths fabricated vertically on the even numbered layers, and a second multi-layer ring oscillator (FIG. 6) may comprise feedback paths fabricated horizontally on the odd numbered layers.

Figure 7A:
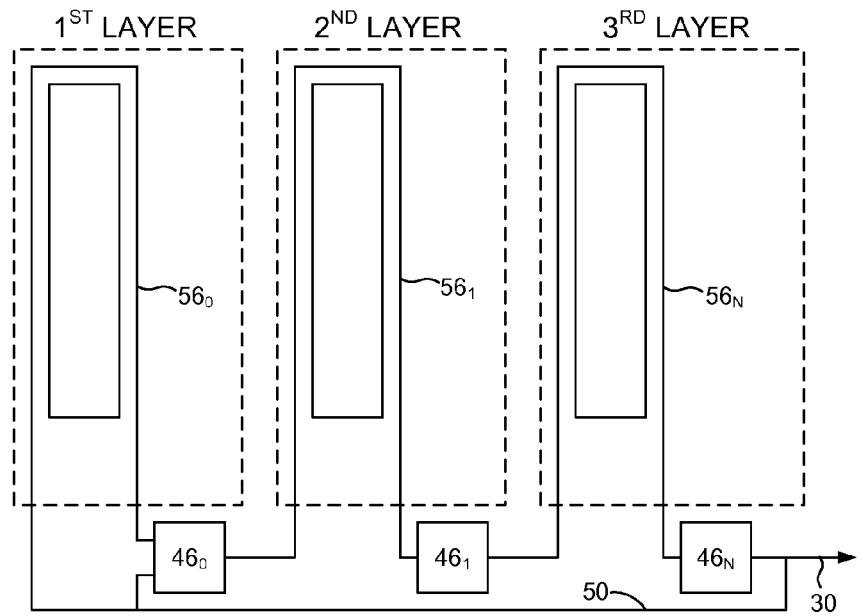
FIG. 7A shows a multi-layer ring oscillator according to an embodiment of the present invention wherein the interconnect between inverting elements are fabricated on different layers.

FIG. 7A shows an alternative embodiment of a multi-layer ring oscillator wherein the interconnects between the inverting elements are fabricated on different layers. For example, a first interconnect $56_1$ fabricated on a first layer couples an output of a first inverting element $46_0$ to an input of a second inverting element $46_1$, and a second interconnect $56_N$ fabricated on a second layer couples the output of the second inverting element $46_1$ to an input of a third inverting element $46_N$. This embodiment adjusts the supply voltage to maintain a target average propagation delay across the layers (or adjusts the clocking frequency to compensate for changes in the average propagation delay).

Figure 7B:
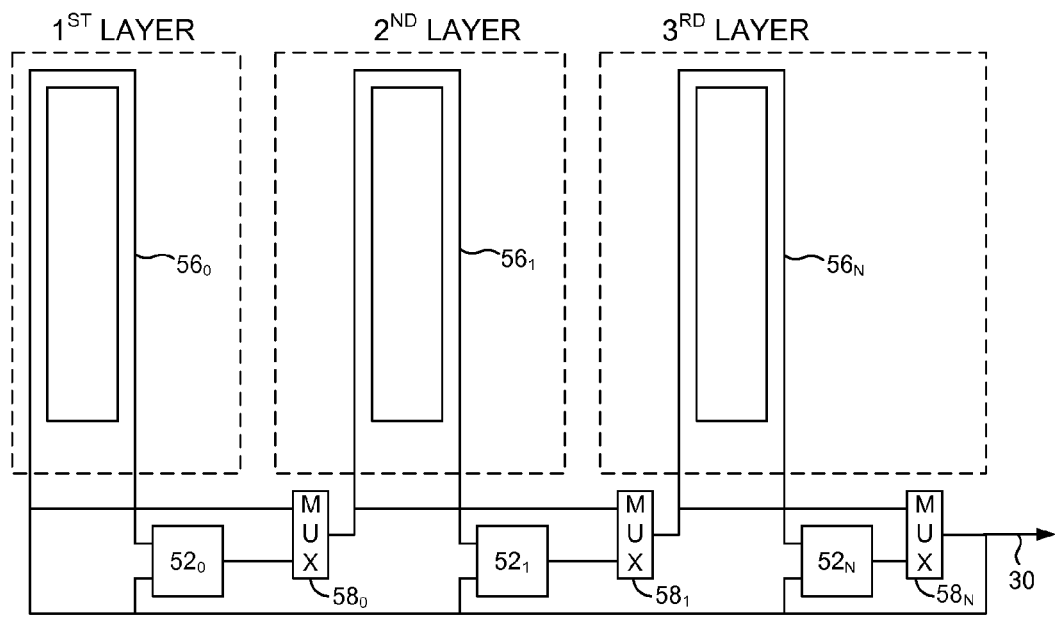
FIG. 7B shows an embodiment of a multi-layer ring oscillator according to an embodiment of the present invention comprising a configurable number of inverting elements.

FIG. 7B shows an embodiment wherein the multi-layer ring oscillator of FIG. 7A is configurable using multiplexers $58_0$-$58_N$ to selectively omit one or more layers. That is, the multiplexers are configured to bypass the interconnect $56_i$ and the inverting element $52_i$ in order to remove it from the multi-layer ring oscillator. In one embodiment, the bypass path within each multiplexer $58_i$ may include an inverted path and a non-inverted path so that the number of inverting elements in the ring oscillator remains an odd number.

Figure 8:
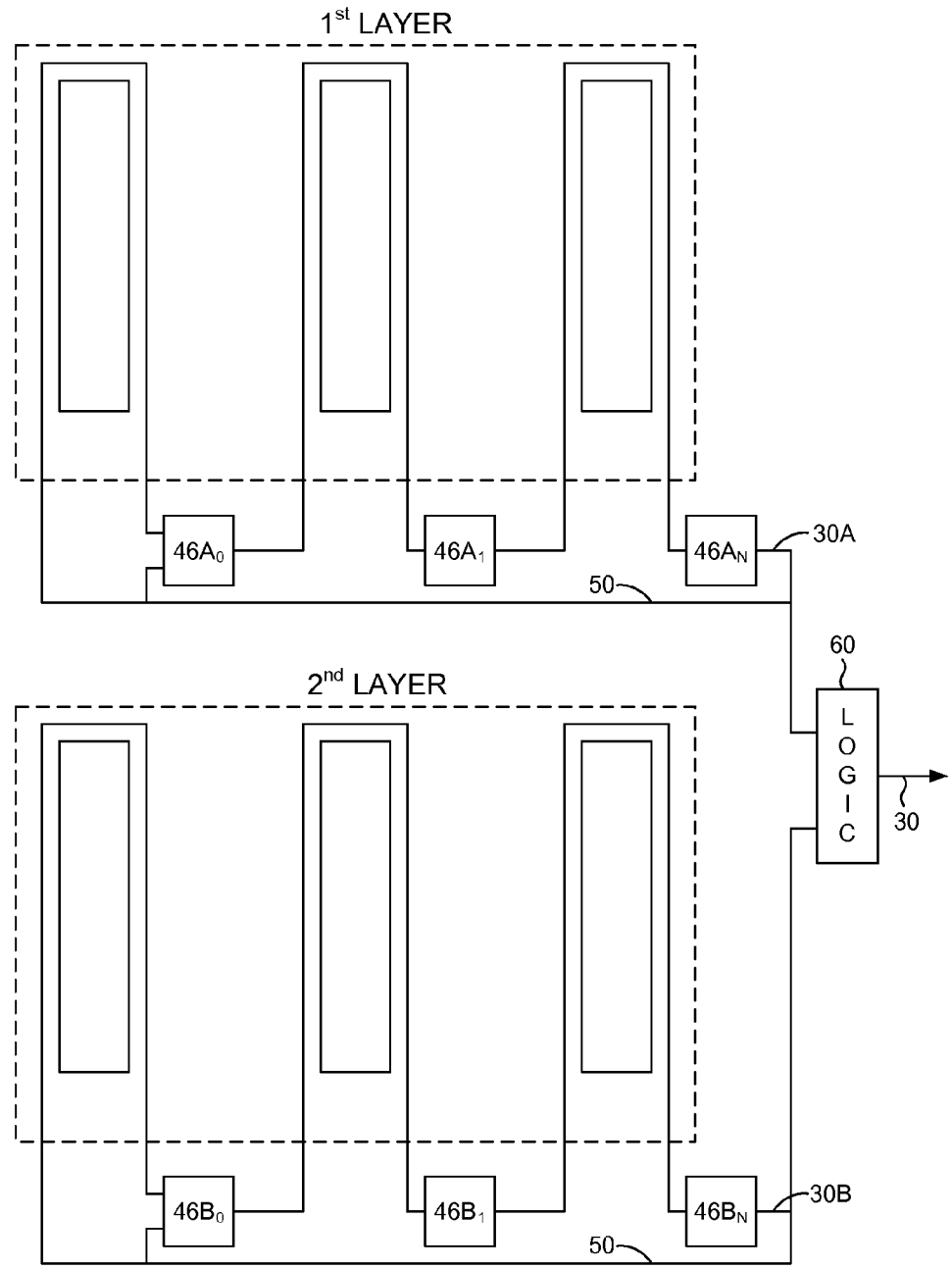
FIG. 8 shows an embodiment of a multi-layer ring oscillator according to an embodiment of the present invention wherein the interconnect between inverting elements are fabricated on different layers.

FIG. 8 shows yet another embodiment of a multi-layer ring oscillator comprising a first set of inverting elements $46A_0$-$46A_N$ connected in a ring using interconnects fabricated on a first layer, and a second set of inverting elements $46B_0$-$46B_N$ connected in a ring using interconnects fabricated on a second layer. A logic circuit 60 selects the slower frequency between the outputs 30A and 30B as the propagation delay frequency 30 compared 36 to the reference frequency 38 in FIG. 2. The first and second set of inverting elements may be fabricated together on a single layer, or they may be fabricated on different layers (e.g., on the same as or different from the interconnect layers). Also in this embodiment (as well as the above embodiments), the interconnects fabricated on the different layers may be aligned vertically over on another, or they may be fabricated at different locations on their respective layers. The embodiment of FIG. 8 may also be modified to included more than two sets of inverting elements having interconnects fabricated on different layers. In addition, the logic circuit 60 may comprise configuration circuitry for selectively omitting one or more of the layers as desired.

Similar configuration circuitry may also be added to the above embodiments in order to selectively omit one or more layers as desired (e.g., omit one or more feedback paths in the embodiment of FIG. 3). For example, in one embodiment only a subset of the layers may be active during a particular operating mode of the digital circuitry 26, and therefore the non-active layers may be omitted from the multi-layer ring oscillator 28 while the digital circuitry 26 is operating in a respective mode.

An embodiment of the present invention may employ different types of multi-layer ring oscillators (e.g., FIG. 4 and FIG. 7A) together with a logic circuit that selects between the frequency errors 40 that is used to adjust 44 at least one of the supply voltage and the clocking frequency 42. In other embodiments, different types of ring oscillators may be employed, such as the multi-layer ring oscillator described above together with a single layer ring oscillator matched to a critical path circuit fabricated on a particular layer, as well as a logic circuit for selecting between the resulting frequency errors. In yet another embodiment, the multi-layer ring oscillator described above may also be matched to a critical path circuit in the digital circuitry (or matched to a multiple of the critical path circuit) with respect to the interconnect delays and/or the gate delays of the critical path circuit.

What is claimed is:

1. A computing device comprising:
   digital circuitry fabricated on a first layer and a second layer of a multi-layer integrated circuit;
   a first multi-layer ring oscillator operable to generate a propagation delay frequency representing a propagation delay of the integrated circuit, wherein the first multi-layer ring oscillator comprises a first interconnect fabricated on the first layer and a second interconnect fabricated on the second layer;
   a reference frequency;
   a frequency comparator for generating a frequency error representing a difference between the reference frequency and the propagation delay frequency; and
   an adjustable circuit, responsive to the frequency error, for adjusting at least one of a supply voltage and a clocking frequency applied to the digital circuitry.

2. The computing device as recited in claim 1, wherein the first interconnect comprises a first feedback path and the second interconnect comprises a second feedback path.

3. The computing device as recited in claim 1, wherein:
the first interconnect connects an output of a first inverting element to an input of a second inverting element; and
the second interconnect connects an output of the second inverting element to an input of a third inverting element.

4. The computing device as recited in claim 2, wherein the first multi-layer ring oscillator further comprises:
a first AND gate having a first active high input coupled to the first feedback path and a second active high input coupled to the second feedback path; and
a second AND gate having a first active low input coupled to the first feedback path and a second active low input coupled to the second feedback path.

5. The computing device as recited in claim 4, wherein:
the first multi-layer ring oscillator further comprises a third feedback path shorter than the first and second feedback paths; and
the third feedback path enables an output of the first and second AND gates.

6. The computing device as recited in claim 1, wherein the first multi-layer ring oscillator comprises a configurable number of inverting elements.

7. The computing device as recited in claim 6, wherein the first multi-layer ring oscillator further comprises a multiplexer for configuring the number of inverting elements.

8. The computing device as recited in claim 1, wherein at least one of the first and second interconnects comprises a serpentine pattern.

9. The computing device as recited in claim 8, further comprising a second multi-layer ring oscillator comprising a third interconnect fabricated on a third layer and a fourth interconnect fabricated on a fourth layer, wherein the first, second, third and fourth layers are interleaved.

10. The computing device as recited in claim 9, wherein:
at least one of the third and fourth interconnects comprises a serpentine pattern;
the first interconnect comprises a serpentine pattern oriented in a first direction; and
the third interconnect comprises a serpentine pattern oriented in a second direction different from the first direction.

11. The computing device as recited in claim 10, wherein the first and second directions are orthogonal.

12. The computing device as recited in claim 1, further comprising a logic circuit operable to selectively omit one of the first and second interconnects from the first multi-layer ring oscillator.

13. A method of operating a computing device comprising digital circuitry fabricated on a first layer and a second layer of a multi-layer integrated circuit, a first multi-layer ring oscillator operable to generate a propagation delay frequency representing a propagation delay of the integrated circuit, wherein the first multi-layer ring oscillator comprises a first interconnect fabricated on the first layer and a second interconnect fabricated on the second layer, the method comprising:

generating a frequency error representing a difference between a reference frequency and the propagation delay frequency; and
adjusting at least one of a supply voltage and a clocking frequency applied to the digital circuitry in response to the frequency error.

14. The method as recited in claim 13, wherein the first interconnect comprises a first feedback path and the second interconnect comprises a second feedback path.

15. The method as recited in claim 13, wherein:
the first interconnect connects an output of a first inverting element to an input of a second inverting element; and
the second interconnect connects an output of the second inverting element to an input of a third inverting element.

16. The method as recited in claim 14, wherein the first multi-layer ring oscillator further comprises:
a first AND gate having a first active high input coupled to the first feedback path and a second active high input coupled to the second feedback path; and
a second AND gate having a first active low input coupled to the first feedback path and a second active low input coupled to the second feedback path.

17. The method as recited in claim 16, wherein:
the first multi-layer ring oscillator further comprises a third feedback path shorter than the first and second feedback paths; and
the third feedback path enables an output of the first and second AND gates.

18. The method as recited in claim 13, wherein the first multi-layer ring oscillator comprises a configurable number of inverting elements, the method further comprising configuring the number of inverting elements in the first multi-layer ring oscillator.

19. The method as recited in claim 18, wherein the first multi-layer ring oscillator further comprises a multiplexer for configuring the number of inverting elements.

20. The method as recited in claim 13, wherein at least one of the first and second interconnects comprises a serpentine pattern.

21. The method as recited in claim 20, further comprising a second multi-layer ring oscillator comprising a third interconnect fabricated on a third layer and a fourth interconnect fabricated on a fourth layer, wherein the first, second, third and fourth layers are interleaved.

22. The method as recited in claim 21, wherein:
at least one of the third and fourth interconnects comprises a serpentine pattern;
the first interconnect comprises a serpentine pattern oriented in a first direction; and
the third interconnect comprises a serpentine pattern oriented in a second direction different from the first direction.

23. The method as recited in claim 22, wherein the first and second directions are orthogonal.

24. The method as recited in claim 13, further comprising selectively omitting one of the first and second interconnects from the first multi-layer ring oscillator.

* * * * *